(12) United States Patent
Agarwal et al.

(10) Patent No.: US 8,009,398 B2
(45) Date of Patent: Aug. 30, 2011

(54) ISOLATING FAULTY DECOUPLING CAPACITORS

(75) Inventors: Vikas Agarwal, Austin, TX (US); Sanjay Dubey, Austin, TX (US); Ankit K. Gheedia, Bangalore (IN); Nikhil Kejriwal, West Bengal (IN); Sankara Reddy S. Kommareddi, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/478,477

(22) Filed: Jun. 4, 2009

(65) Prior Publication Data

US 2010/0308663 A1    Dec. 9, 2010

(51) Int. Cl.
*H02H 3/22*    (2006.01)
(52) U.S. Cl. ............................. 361/56; 361/111
(58) Field of Classification Search .......... 361/56, 361/111; 257/355–360
See application file for complete search history.

(56) References Cited

U.S. PATENT DOCUMENTS

| | | | |
|---|---|---|---|
| 5,506,457 A | 4/1996 | Krauter et al. | |
| 5,789,964 A | 8/1998 | Voldman | |
| 5,818,268 A * | 10/1998 | Kim et al. | 327/77 |
| 6,307,250 B1 | 10/2001 | Krauter et al. | |
| 6,342,790 B1 | 1/2002 | Ferguson et al. | |
| 6,644,771 B1 | 11/2003 | Silverbrook | |
| 6,844,771 B1 * | 1/2005 | Chen | 327/379 |
| 7,292,421 B2 | 11/2007 | Smith | |

* cited by examiner

*Primary Examiner* — Danny Nguyen
(74) *Attorney, Agent, or Firm* — Patterson & Sheridan, LLP; James R. Nock

(57) ABSTRACT

The present invention generally provides a decoupling capacitor circuit that is configured to determine whether a decoupling capacitor is defective. Upon determining that the decoupling capacitor is defective, the decoupling capacitor circuit may disconnect the decoupling capacitor from both, a positive segment and a negative segment of a power grid. In some embodiments, the decoupling capacitor circuit may be configured to reconnect the decoupling capacitor to the power grid upon receiving a reset signal.

16 Claims, 4 Drawing Sheets

ISOLATING FAULTY DECOUPLING CAPACITORS

BACKGROUND OF THE INVENTION

Description of the Related Art

Advances in semiconductor fabrication have allowed millions of circuit elements such as transistors to be placed on a single integrated circuit. Such densely packed integrated circuits typically operate at low power and high frequencies. During operation of an integrated circuit, transistors contained therein may be continuously switched, thereby rapidly changing currents flowing within the integrated circuit. The availability of current for switching operations may affect one or more voltages on a power grid of the integrated circuit. If the power grid is unable to provide sufficient current for the switching operations, voltage fluctuations on the power grid may erroneously change the state of the integrated circuit or integrated circuit components.

To provide sufficient current during switching of transistors, decoupling capacitors may be placed at strategic locations on power consuming circuits. For example, in memories and processors, decoupling capacitors may be placed at one or more locations along a power grid where spikes in current requirements are likely to occur. Placing localized a decoupling capacitor along the power grid near a circuit element provides an additional source of current during the spikes in current requirements. Therefore, the effects of voltage fluctuations may be made less severe. For example, when a greater amount of current is desired, electrical charge stored in the capacitor may flow to the circuit element, thereby providing additional current for switching operations. Providing the additional current may reduce or eliminate harmful voltage fluctuations.

SUMMARY OF THE INVENTION

Embodiments of the invention generally relate to decoupling capacitors, and more specifically to disconnecting defective decoupling capacitors from a power grid.

One embodiment of the invention provides a circuit generally comprising a decoupling capacitor coupled between a positive segment and negative segment of a power grid, and a sense capacitor configured to detect leakage of current in the decoupling capacitor. In response to detecting the leakage of current, the sense capacitor may be configured to disconnect the decoupling capacitor from the positive segment and the negative segment of the power grid.

Another embodiment of the invention provides a method for operating a circuit. The method generally comprises detecting leakage current in the decoupling capacitor, wherein the leakage current is detected by a sense capacitor, and in response to detecting the leakage of current, disconnecting the decoupling capacitor from the positive segment and the negative segment of the power grid.

Yet another embodiment of the invention provides an integrated circuit comprising a power grid comprising a positive segment and a negative segment, at least one circuit coupled with the positive segment and the negative segment, and at least one decoupling capacitor circuit. The decoupling capacitor circuit generally comprises a decoupling capacitor coupled between the positive segment and the negative segment of the power grid, and a sense capacitor configured to detect leakage of current in the decoupling capacitor and, in response to detecting the leakage of current, disconnect the decoupling capacitor from the positive segment and the negative segment of the power grid.

BRIEF DESCRIPTION OF THE DRAWINGS

It is to be noted that the appended drawings illustrate only typical embodiments of this invention and are therefore not to be considered limiting of its scope, for the invention may admit to other equally effective embodiments.

DETAILED DESCRIPTION

Embodiments of the invention generally provide a decoupling capacitor circuit that is configured to determine whether a decoupling capacitor is defective. Upon determining that the decoupling capacitor is defective, the decoupling capacitor may be disconnected from both, a positive segment and a negative segment of a power grid. In some embodiments, the decoupling capacitor circuit may be configured to reconnect the decoupling capacitor to the power grid upon receiving a reset signal.

In the following, reference is made to embodiments of the invention. However, it should be understood that the invention is not limited to specific embodiments described herein. Instead, any combination of the following features and elements, whether related to different embodiments or not, is contemplated to implement and practice the invention. The following aspects, features, embodiments and advantages are merely illustrative and are not considered elements or limitations of the appended claims except where explicitly recited in a claim(s).

Embodiments of the invention may generally be used with any type of integrated circuit including, for example, processors, memory controllers, memories, or the like. Embodiments of the invention may also be used in system-on-a-chip (SOC) devices which may include one or more integrated circuits formed on a single die. In both situations, where multiple integrated circuits are integrated into a SOC device and where the integrated circuit is provided as a separate device, the integrated circuit may be used as part of a larger computer system. The computer system may include a motherboard, central processor, memory controller, the memory, a hard drive, graphics processor, peripherals, and any other devices which may be found in a computer system. The computer system may be part of a personal computer, laptop computer, a server computer, or a smaller system such as an embedded system, personal digital assistant (PDA), or mobile phone.

Figure 1:
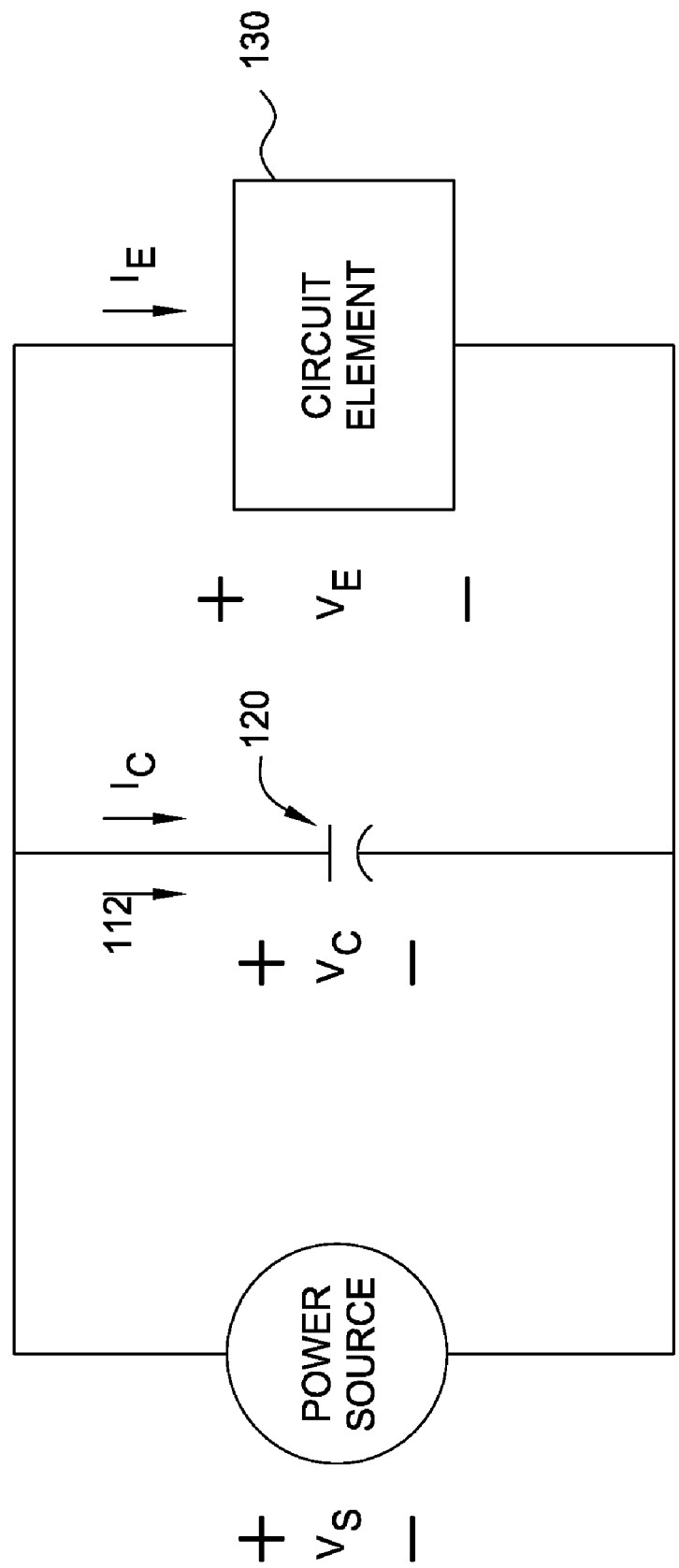
FIG. 1 is a circuit diagram illustrating an exemplary decoupling capacitor according to an embodiment of the invention.

FIG. 1 illustrates an exemplary circuit 100 including a decoupling capacitor. As illustrated, circuit 100 may include a power source 110, decoupling capacitor 120, and circuit 130. Decoupling capacitors are generally placed parallel to a power source. Therefore, charge buildup on the decoupling capacitors results in a voltage across the capacitor that is equal to the voltage supplied by the power source. For example, in FIG. 1, decoupling capacitor 120 is placed parallel to the power source 110. Therefore, in a steady state, the voltage ($V_C$) across the decoupling capacitor 120 is equal to the voltage ($V_S$) across the power source 110.

Power source 110 provides power to circuit 130. Accordingly, circuit element 110 is shown consuming current ($I_E$) and having a voltage ($V_E$) across the circuit element. Rapid switching of transistors in circuit 130 may require a periodic boost in the current $I_E$. Spikes in current consumption, however, may result in fluctuations in the voltage $V_E$ across circuit 130. Typically, such voltage fluctuations are undesirable because they may adversely affect high frequency circuits such as the circuit 130. For example, the voltage fluctuations may result in undesired state changes, functional failures in logic, timing violations, and the like, in circuit 130.

Placing localized decoupling capacitors along the power grid near a circuit remedies the above mentioned problems by providing a source of current during spikes in current requirements. Therefore, effects of voltage fluctuations may be made less severe. For example, when a greater amount of current is desired, electrical charge stored in the capacitor 120 may flow to the circuit 130, thereby providing additional current. Providing additional current may reduce fluctuation in the voltage $V_E$. Decoupling capacitors are generally placed at strategic locations across most integrated circuits to maintain steady supply voltages. For example, in an integrated circuit such as, for example, a Dynamic Random Access Memory (DRAM), a plurality of decoupling capacitors may be placed at one or more locations along the power grid where current spikes may be likely.

In recent years, the size and proximity of integrated circuit components have been reduced such that more may be packed components into smaller devices. However, reducing the size of components such as decoupling capacitors has resulted in an increased risk of defects during fabrication. While some components of an integrated circuit, for example, memory arrays of a memory device, are tested and repaired using redundant elements or simply disconnected, testing of decoupling capacitors is typically not performed.

A defective decoupling capacitor may result in a short circuit leading to high leakage currents and high power consumption. For example, in FIG. 1, if capacitor 120 was defective, resulting in a short circuit, the supply of power to the circuit element may be hindered due to the leakage of current $I_C$ through current path 112. Traditionally, setbacks occurring with defective capacitors have been solved by specifying sufficiently high stand by currents for the device. However, in many low power integrated circuits, for example, processors and memories used in mobile devices, standby and self refresh current specifications have been significantly reduced. With such specifications, defects in decoupling capacitors result in high yield losses if defective decoupling capacitors are not disconnected. Moreover, leakage currents from defective decoupling capacitors may generate noise in an integrated circuit, which may adversely affect proper functioning of the integrated circuit.

Figure 2:
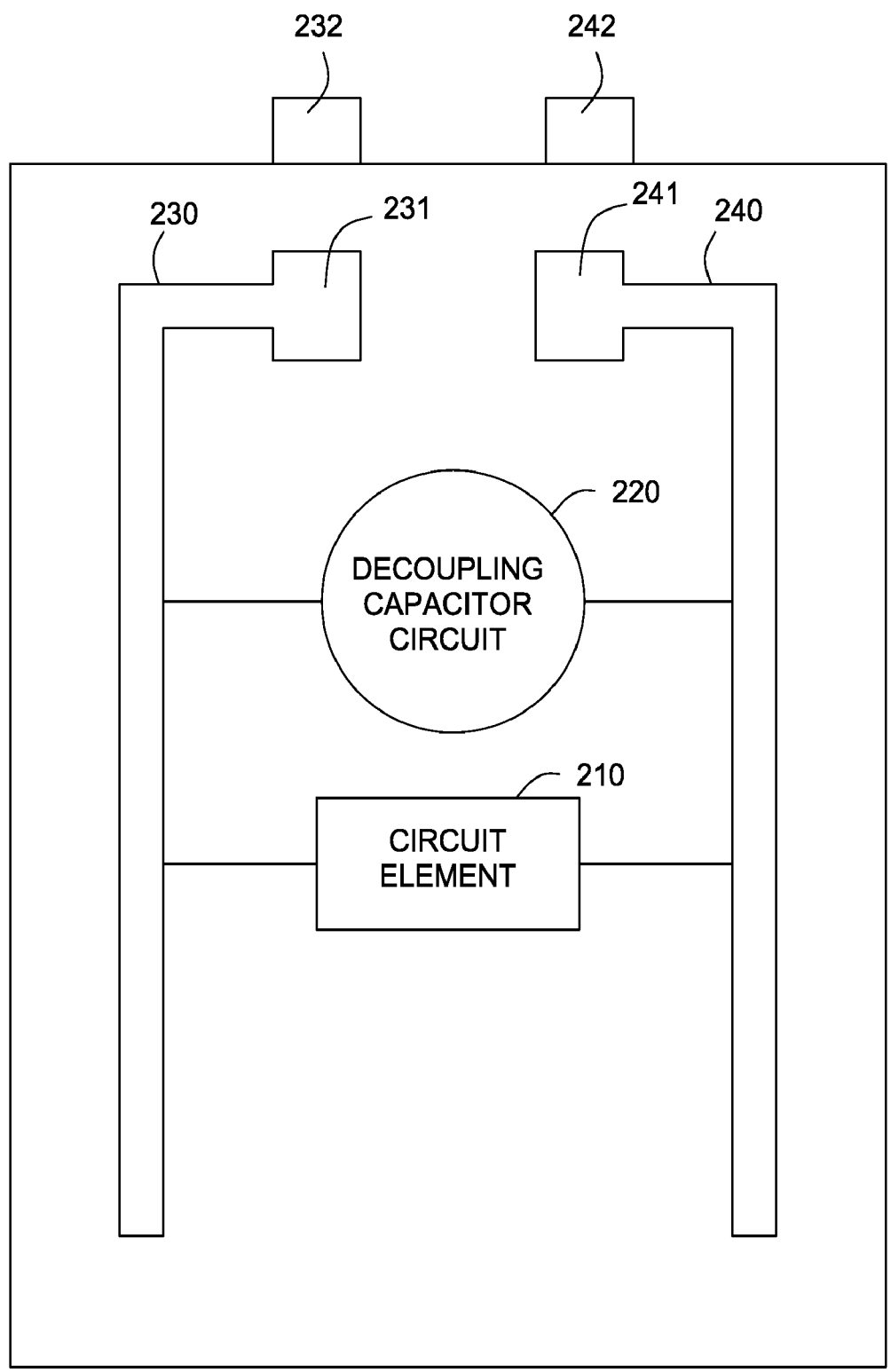
FIG. 2 illustrates an exemplary system according to an embodiment of the invention.

FIG. 2 is a block diagram of an exemplary integrated circuit (IC) 200 according to an embodiment of the invention. IC 200 may be formed on a semiconductor material, for example, on a silicon substrate. As illustrated, IC 200 includes at least one circuit 210, and at least one decoupling capacitor circuit 220, a positive segment of the power grid 230 and a negative segment of the power grid 240.

The circuit 210 may include any combination of semiconductor devices and passive devices. Exemplary semiconductor devices include diodes and transistors (for example, bipolar junction transistors (BJTs), Metal Oxide Semiconductor Field Effect Transistors (MOSFETs), and the like). Semiconductor devices generally require power to perform an intended function. On the other hand, passive components do not require power to perform an intended function. Exemplary passive components include resistors, capacitors, inductors, and the like.

The circuit 210 may be connected to the positive segment 230 and negative segment 240 of the power grid to receive power required to operate the circuit element. In one embodiment of the invention, negative segment 240 of the power grid may be connected to ground. As illustrated in FIG. 2, the positive and negative segments of the power grid may include connector pads 231 and 241 to receive input from one or more external power supplies. For example, pads 231 and 241 may be coupled with respective connector pin 232 and 242 of the IC 200, to which the power supply may be connected. Exemplary external power sources include current sources and voltage sources.

As illustrated in FIG. 2, a decoupling capacitor circuit 220 may be placed at a strategic location along the power grid to ensure a steady voltage across the circuit element 210. In one embodiment of the invention, the decoupling capacitor circuit 220 may be formed as a gate capacitor, as is described below. During operation of IC 200, the switching of one or more transistors in the circuit element 210 may result in the drawing of large amounts of current from the power grid. Because of the inductive characteristics of the circuit elements or connectors to external sources, the spikes in current may result in voltage fluctuations if a decoupling capacitor is not provided. Such voltage fluctuations may be based on the rate of change of current as illustrated by the equation below, $$V = L\frac{di}{dt}$$

wherein V is the voltage provided by the power grid to the circuit element, L is an equivalent inductance of the circuit element, and di/dt is the rate of change of current. The voltage fluctuations may adversely affect performance of the circuit element.

Figure 3:
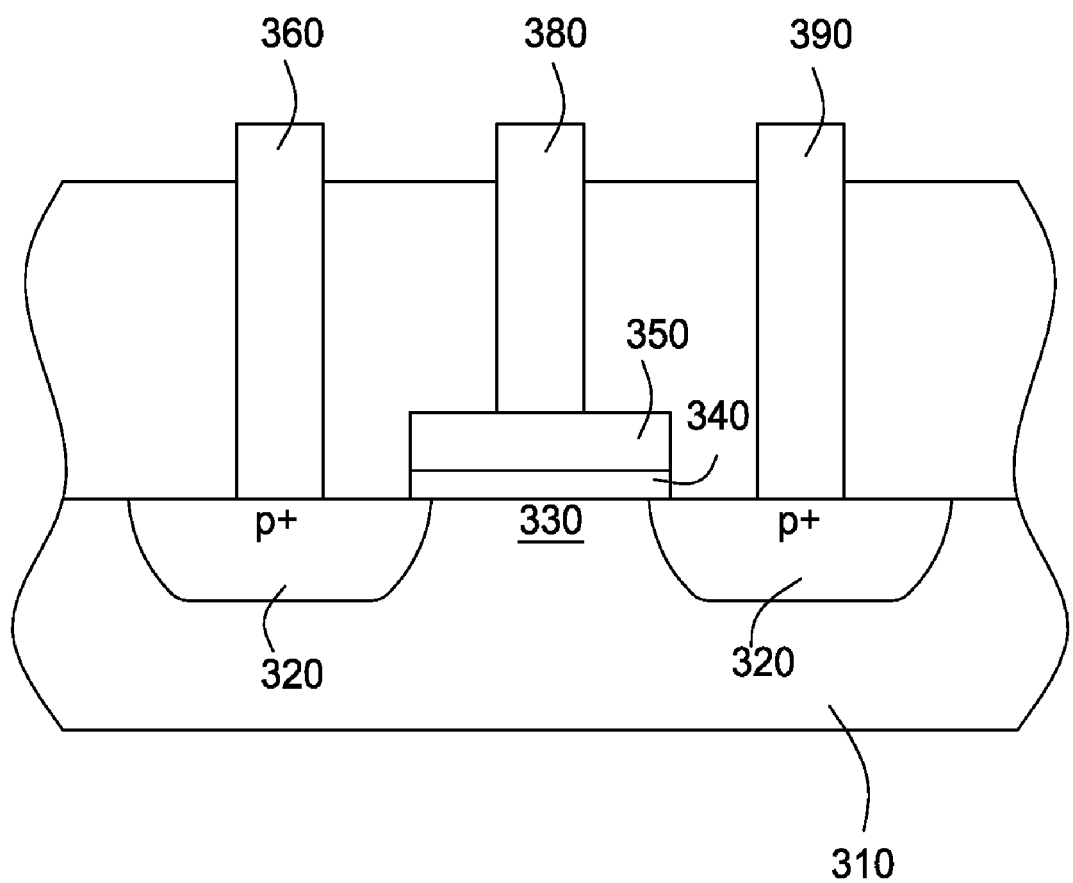
FIG. 3 illustrates an exemplary Metal Oxide Semiconductor (MOS) decoupling capacitor according to an embodiment of the invention.

In one embodiment of the invention, the decoupling capacitor circuit 220 may include a Metal Oxide Semiconductor (MOS) decoupling capacitor. The MOS decoupling capacitor is also referred to herein as a gate capacitor. FIG. 3 illustrates an exemplary gate capacitor 300 according to an embodiment of the invention. As illustrated in FIG. 3, the gate capacitor 300 may be formed on a substrate 310. The substrate may be formed with any suitable semiconductor material for example, silicon, silicon-germanium, or the like. In one embodiment of the invention, the substrate 310 may also be used to form one or more other circuits (not shown) of an integrated circuit. For example, in a memory device, memory cells and memory logic circuits may also be formed on the same substrate 310.

As illustrated in FIG. 3, decoupling capacitor 300 may be formed as a p-MOS device in one embodiment. Accordingly, the substrate 310 may be doped with a suitable n-type dopant. Two wells 320 comprising a suitable p-type dopant may be formed in the substrate. The wells 320 may represent source and drain regions of the p-MOS device. An insulation layer 340 may be formed over the channel region 330 of the p-MOS device. In one embodiment of the invention, the insulation layer 340 may be an oxide layer, for example, silicon dioxide. A gate structure 350 may be formed on the oxide layer 340, as illustrated in FIG. 3. In one embodiment of the invention, the gate structure 350 may be formed with polysilicon. Further, as illustrated in FIG. 3, contacts 360, 370, and 380 may be formed on the two well regions 320 and the gate structure 350.

In one embodiment of the invention, the gate structure 350 may form a first electrode of a decoupling capacitor 300, the substrate 310 may form a second electrode of the decoupling capacitor 300, and the insulation layer 340 may act as a dielectric material separating the first electrode and the second electrode. Accordingly, in one embodiment of the invention, the contact 380 may be coupled with a positive segment of a power grid (not shown in FIG. 3), and the contacts 360 and 370 may be coupled to a negative segment of the power grid. Alternatively, in some embodiments, the contacts 360 and 370 may be coupled to a positive segment of a power grid and the contact 380 may be coupled to a negative segment of the power grid.

While FIG. 3 illustrates a p-MOS device structure that is used to form a decoupling capacitor, it should be obvious to one skilled in the art that in an alternative embodiment, n-MOS devices may also be used to form a decoupling capacitor. An n-MOS decoupling capacitor may be similar in structure to the p-MOS device illustrated in FIG. 3, but may include a p-doped substrate with n-wells.

As device geometries continue to shrink, the insulation layer 340 of the decoupling capacitor 300 may also be commensurately shrunk. However, as the thickness of the insulation layer 340 shrinks, the probability of defects occurring in the insulation layer 340 during fabrication increases. For example, if the insulation layer 340 is faultily formed with less than a desired thickness, the insulation layer 340 may break down when the electrodes of the decoupling capacitor 300 are coupled with the positive and negative segments of a power supply, which may lead to current leakage between the electrodes, increased power consumption, and noise in an integrated circuit that includes the defective decoupling capacitor 300.

Figure 4:
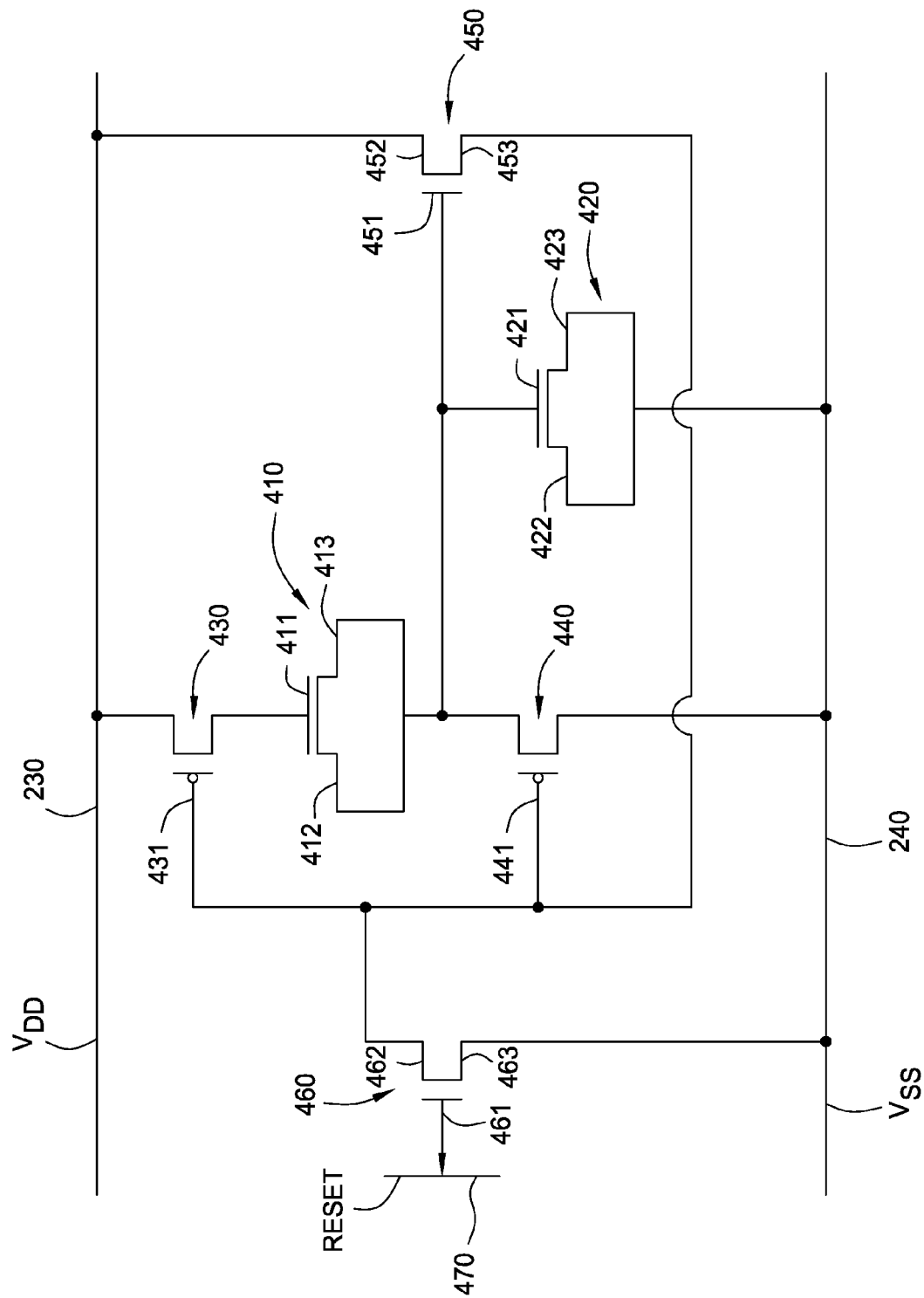
FIG. 4 illustrates an exemplary decoupling capacitor circuit according to an embodiment of the invention.

Embodiments of the invention provide a decoupling capacitor circuit configured to disconnect a defective decoupling capacitor from the power grid, thereby preventing adversely affecting the operation of the circuit because of the current leak. FIG. 4 illustrates an exemplary decoupling capacitor circuit 400 according to an embodiment of the invention. The decoupling capacitor circuit 400 may correspond to the decoupling capacitor circuit 220 illustrated in FIG. 2. As illustrated in FIG. 3, the decoupling capacitor circuit may include a decoupling capacitor 410, a sense capacitor 420, and transistors 430, 440, 450, and 460.

In one embodiment of the invention, the decoupling capacitor 410 may be a MOS decoupling capacitor, for example, the decoupling capacitor 300 illustrated in FIG. 3. Accordingly, a gate structure 411 of the decoupling capacitor 410 may be coupled with a positive segment 230 of a power grid via the transistor 430, as illustrated in FIG. 4. Further, source region 412 and drain region 413 of the MOS decoupling capacitor may be coupled with a negative segment 240 of the power grid via the transistor 440.

In one embodiment of the invention, the sense capacitor 420 may also be formed as a MOS capacitor. As illustrated in FIG. 4, a gate structure 421 of the sense capacitor may be coupled with the source region 412 and drain region 413 of the decoupling capacitor 410. A source region 422 and drain region 423 of the sense capacitor may be coupled to the negative segment 240 of the power grid. In one embodiment of the invention, the sense capacitor 420 may be smaller in size than the decoupling capacitor 410.

As illustrated in FIG. 4, the gate structure 421 of the sense capacitor 420 is also coupled with a gate 451 of the transistor 450. In one embodiment of the invention, the transistor 450 may be an n-channel Metal Oxide Semiconductor Field Effect Transistor (n-MOS). Further, as illustrated in FIG. 4, a source region 452 of the transistor 450 may be coupled with the positive segment 230 of the power grid. A drain region 453 of the transistor 450 may be coupled with the gates 431 and 441 of transistors 430 and 440 respectively, as depicted in FIG. 4. The internal capacitance of the transistor 450 may be parallel to the decoupling capacitor 410, thereby increasing the total decoupling capacitance available to an integrated circuit that includes the decoupling capacitor circuit 400.

In one embodiment of the invention, the positive segment 230 of the power grid may be configured to receive a "high" voltage value from a power source and the negative segment 240 of the power grid may be configured to receive a "low" voltage value from a power source. In a particular embodiment, the negative segment 240 of the power grid may be coupled to ground. In general, the voltage on the positive segment 230 of the power grid may be greater than the voltage on the negative segment 240 of the power grid.

In one embodiment of the invention, the transistors 430 and 440 may be p-channel Metal Oxide Semiconductor Field Effect Transistors (p-MOS). During operation of an integrated circuit encompassing the decoupling capacitor circuit 400, a "low" voltage may be applied to the gates 431 and 441 of the transistors 430 and 440. Because the transistors 430 and 440 may be p-MOS transistors, applying a low voltage to the gates 431 and 441 may "turn on" the transistors 430 and 440. In other words, the transistors 430 and 440 may conduct current and couple respective electrodes of the decoupling capacitor 410 to the positive segment 230 and positive segment 240 of the power grid.

As discussed above, if the decoupling capacitor 410 is defective, then a current leak may occur, which may result in a charge build up on the gate structure 421 of the sense capacitor 420. As the charge builds up on the gate structure 421, the voltage at the gate structure 421, and consequently the gate 451 of transistor 450 may increase. If the voltage at the gate 451 reaches a predefined voltage, the transistor 450 may be turned on, thereby connecting the positive segment 230 of the power grid to the gates 431 and 441 of transistors 430 and 440.

Because the transistors 430 and 440 are p-MOS transistors, receiving a high voltage at the gates 431 and 441 from the positive segment 230 of the power supply may result in the transistors 430 and 440 being turned off, thereby disconnecting the defective decoupling capacitor 410 from both, the positive segment 230 and the negative segment 240 of the power grid. Disconnecting the decoupling capacitor 410 from both the positive segment 230 and the negative segment 240 of the power grid may prevent the decoupling capacitor 410 from leaking current, or otherwise adversely affecting the operation of the integrated circuit.

In one embodiment of the invention, the decoupling capacitor circuit 400 may include an n-MOS transistor 460. The n-MOS transistor 460 may be configured to reconnect a disconnected decoupling capacitor to the power grid. As illustrated in FIG. 4, a source region 462 of the transistor 460 may be coupled with the gates 431 and 441 of the transistors 430 and 440. A drain region 463 of the transistor 460 may be coupled with a negative segment 240 of the power grid. A gate 461 of the transistor may be coupled with a reset line 470. When a reset signal is asserted on the reset line 470, the transistor 460 may be turned on thereby connecting the gates 431 and 441 of the transistors 430 and 440 to the negative segment 240 of the power supply. The low voltage from the negative segment 240, when applied to the gates 431 and 441, may turn on the transistors 430 and 440, thereby reconnecting a disconnected decoupling capacitor 410 to the power grid.

The reset signal may be asserted, for example, during power up of an integrated circuit including the decoupling capacitor circuit 400. In some embodiments, the reset signal may be asserted in response to user input directed to the integrated circuit. In some cases, the reset signal may also be asserted based on one or more performance parameters of the integrated circuit, for example, increased error or failure rates, increased noise, and the like.

While the transistor 460 is shown as an n-MOS in FIG. 4, it should be obvious to one skilled in the art that in alternative embodiments, the transistor 460 may also be implemented as a p-MOS transistor. If the transistor 460 is an n-MOS transistor, asserting a reset signal may involve asserting a first predefined value on the reset line to turn on transistor 460. On the other hand if the transistor 460 is a p-MOS transistor, asserting the reset signal may involve asserting a second predefined value on the reset line.

By providing a decoupling capacitor circuit which is capable of disconnecting a decoupling capacitor from positive and negative segments of a power grid, embodiments of the invention obviate the problems associated defectively fabricated decoupling capacitors in an integrated circuit.

While the foregoing is directed to embodiments of the present invention, other and further embodiments of the invention may be devised without departing from the basic scope thereof, and the scope thereof is determined by the claims that follow.

What is claimed is:

1. A circuit, comprising:
   decoupling capacitor coupled between a positive segment and negative segment of a power grid;
   a sense capacitor configured to detect leakage of current in the decoupling capacitor and, in response to detecting the leakage of current, disconnect the decoupling capacitor from the positive segment and the negative segment of the power grid;
   a first switch that couples a first electrode of the decoupling capacitor to a positive segment of a power grid; and
   a second switch that couples a second electrode of the decoupling capacitor to a negative segment of the power grid,
   wherein a first electrode of the sense capacitor is coupled with the second electrode of the decoupling capacitor and a second electrode of the sense capacitor is coupled with the negative segment of the power grid.

2. The circuit of claim 1, further comprising a third switch that couples control inputs of the first switch and the second switch to the positive segment of the power supply, wherein a control input of the third switch is coupled with the first electrode of the sense capacitor.

3. The circuit of claim 2, further comprising a fourth switch that couples the control inputs of the first switch and second switch to the negative segment of the power supply, wherein a control input of the fourth switch is coupled with a reset line.

4. The circuit of claim 3, wherein asserting a reset signal on the reset line turns on the fourth switch, the by connecting the negative segment of the power grid to the control inputs of the first switch and the second switch.

5. The circuit of claim 4, wherein connecting the negative segment of the power grid to the control inputs of the first switch and the second, switch turns on the respective first switch and second switch, thereby connecting the first electrode of the decoupling capacitor to the positive segment of the power supply and the second electrode of the decoupling capacitor to the negative segment of the power supply.

6. The circuit of claim 2, wherein the first electrode of the sense capacitor is configured to receive electrical charges that pass through the decoupling capacitor, wherein the electrical charges stored in the first electrode of the sense capacitor increase a voltage at the control gate of the third switch.

7. The circuit of claim 6, wherein the third switch is configured to turn on when the voltage at the control gate of the third switch is greater than a predefined voltage, wherein turning on the third switch connects the positive segment of the power grid to the control inputs of the first switch and the second switch, thereby disconnecting the decoupling capacitor from the positive segment of the power supply and the negative segment of the power supply.

8. A method for operating a circuit, comprising:
   detecting leakage current in a decoupling capacitor coupled between a positive segment and negative segment of a power grid, wherein the leakage current is detected by a sense capacitor; and
   in response to detecting the leakage of current, disconnecting the decoupling capacitor from the positive segment and the negative segment of the power grid, wherein:
   a first electrode of a decoupling capacitor is coupled with a positive segment of a power and via a first switch;
   a second electrode of the decoupling capacitor is coupled with a negative segment of the power grid via a second switch;
   a first electrode of the sense capacitor is coupled with the second electrode of the decoupling capacitor;
   a second electrode of the sense capacitor is coupled with the negative segment of the power grid; and
   a third switch couples control inputs of the first switch and the second switch to the positive segment of the power supply, wherein a control input of the third switch is coupled with the first electrode of the sense capacitor.

9. The method of claim 8, wherein a fourth switch couples the control inputs of the first switch and second switch to the negative segment of the power supply, wherein a control input of the fourth switch is coupled with a reset line, and wherein the method further comprises asserting a reset signal on the reset line to turn on the fourth switch, thereby connecting the negative segment of the power grid to the control inputs of the first switch and the second switch.

10. The method of claim 9, wherein connecting the negative segment of the power grid to the control inputs of the first switch and the second switch turns on the respective first switch and second switch, thereby connecting the first electrode of the decoupling capacitor to the positive segment of the power supply and the second electrode of the decoupling capacitor to the negative segment of the power supply.

11. The method of claim 9, wherein the first electrode of the sense capacitor is configured to receive electrical charges that pass through the decoupling capacitor, wherein the electrical charges stored in the first electrode of the sense capacitor increase a voltage at the control gate of the third switch.

12. The method of claim 11, herein the third switch is configured to turn on when the voltage at the control gate of the third switch is greater than a predefined voltage, wherein turning on the third switch connects the positive segment of the power grid to the control inputs of the first switch and the second switch, thereby disconnecting the decoupling capacitor from the positive segment of the power supply and the negative segment of the power supply.

13. An integrated circuit, comprising:
   a power grid comprising a positive segment and a negative segment;

at least one circuit coupled with the positive segment and the negative segment; and at least one decoupling capacitor circuit comprising:

a decoupling capacitor coupled between a positive segment and negative segment of a power grid;

a sense capacitor configured to detect leakage of current in the decoupling capacitor and, in response to detecting the leakage of current, disconnect the decoupling capacitor from the positive segment and the negative segment of the power grid;

a first switch that couples a first electrode of the decoupling capacitor to a positive segment of a power grid; and a second switch that couples a second electrode of the decoupling capacitor to a negative segment of the power grid, wherein a first electrode of the sense capacitor is counted with the second electrode of the decoupling capacitor and a second electrode of the sense capacitor is coupled with the negative segment of the power grid.

14. The integrated circuit of claim 13, further comprising a third switch that couples control inputs of the first switch and the second switch to the positive segment of the power supply, wherein a control input of the third switch is coupled with the first electrode of the sense capacitor.

15. The integrated circuit of claim 14, wherein the first electrode of the sense capacitor is configured to receive electrical charges that pass through the decoupling capacitor, wherein the electrical charges stored in the first electrode of the sense capacitor increase a voltage at the control gate of the third switch.

16. The integrated circuit of claim 15, wherein the third switch is configured to rum on when the voltage at the control gate of the third switch is greater than a predefined voltage, wherein turning on the third switch connects the positive segment of the power grid to the control inputs of the first switch and the second switch, thereby disconnecting the decoupling capacitor from the positive segment of the power supply and the negative segment of the power supply.

* * * * *